United States Patent [19]

Murakami et al.

[11] Patent Number: 5,627,387

[45] Date of Patent: May 6, 1997

[54] OVERVOLTAGE SELF-PROTECTION SEMICONDUCTOR DEVICE, METHOD OF FABRICATION THEREOF AND SEMICONDUCTOR CIRCUIT USING THE SAME

[75] Inventors: Susumu Murakami; Yoshiteru Shimizu, both of Katsuta; Takeshi Yokota, Hitachi; Yasuhiro Mochizuki, Katsuta, all of Japan

[73] Assignee: Hitachi, Ltd., Tokyo, Japan

[21] Appl. No.: 396,259

[22] Filed: Mar. 1, 1995

Related U.S. Application Data

[63] Continuation of Ser. No. 994,969, Dec. 22, 1992, abandoned.

[30] Foreign Application Priority Data

Dec. 26, 1991 [JP] Japan ................................. 3-345197

[51] Int. Cl.$^6$ .................................................. H01L 29/74
[52] U.S. Cl. ......................... 257/173; 257/127; 257/132; 257/167; 257/168; 257/170
[58] Field of Search ........................... 257/127, 132, 257/167, 168, 170, 172, 173; 437/6

[56] References Cited

U.S. PATENT DOCUMENTS

| | | | |
|---|---|---|---|
| 3,838,330 | 9/1974 | Rosa | 321/5 |
| 4,742,382 | 5/1988 | Jaecklin | 357/39 |
| 4,929,563 | 5/1990 | Tsunoda et al. | 437/6 |
| 5,003,369 | 3/1991 | Kanda et al. | 357/38 |
| 5,187,427 | 2/1993 | Erdman | 323/207 |

FOREIGN PATENT DOCUMENTS

| | | | |
|---|---|---|---|
| 0125138 | 11/1984 | European Pat. Off. | 257/173 |
| 59-172771 | 9/1984 | Japan . | |
| 59-158560 | 9/1984 | Japan . | |
| 62-160764 | 7/1987 | Japan | 257/173 |

*Primary Examiner*—J. Carroll
*Attorney, Agent, or Firm*—Antonelli, Terry, Stout & Kraus, LLP

[57] ABSTRACT

A novel semiconductor device with a pair of main surfaces is disclosed, in which at least three semiconductor layers are formed adjacently to each other. The device comprises a main thyristor portion for supplying a main current, an auxiliary thyristor portion, a pilot thyristor portion and a breakover portion. The breakover portion, in turn, includes a semiconductor layer having a high impurities concentration formed on one of the main surfaces, and a plurality of semiconductor layers having a high impurities concentration of opposite conduction type formed adjacently to the semiconductor layer and in spaced relationship from each other.

25 Claims, 9 Drawing Sheets

ELECTRODE FORMATION

RESISTANCE MEASUREMENT
WELL RESISTANCE
RESISTANCE MONITOR

HEAT TREATMENT 1150°C : X MIN.

PRESCRIBED RESISTANCE < ±2.5% VALUE

JUNCTION FORMATION 5,627,387

1

OVERVOLTAGE SELF-PROTECTION SEMICONDUCTOR DEVICE, METHOD OF FABRICATION THEREOF AND SEMICONDUCTOR CIRCUIT USING THE SAME

This is a continuation of application Ser. No. 07/994,969, filed Dec. 22, 1992 abandoned.

BACKGROUND OF THE INVENTION

The present invention relates to a semiconductor device, a method of fabrication thereof and an applied circuit thereof, or more in particular to an overvoltage self-protection semiconductor device, a method of fabrication thereof and a semiconductor circuit using such a circuit capable of self-protection of a semiconductor device against an overvoltage, which turns on safely even upon application thereto of an overvoltage exceeding a breakdown voltage of the semiconductor device.

A prior art example relating to a semiconductor device having the self-protection function against an overvoltage is disclosed in JP-A-59-172771.

According to this conventional device, a thyristor has a voltage breakdown region at a portion thereof where the forward blocking voltage is lower than that in the remaining regions. Specifically, a part of the p-base layer of a thyristor is etched into a well form, and diffused with p-type impurities to form a p-type base layer. The electric field is concentrated in the curved area of a newly-formed p-base layer, thus causing an avalanche breakdown. A pilot thyristor is turned on by the prevailing current as a trigger.

Also, the prior art described in JP-A-59-158560 discloses another conventional semiconductor device having the self-protection function against an overvoltage.

According to this conventional device, a light triggered thyristor has a recess at a part of the p-base region thereof, and a partial thyristor is formed with a thinner n-base, so that when a forward voltage is applied, the pnp portion of the partial thyristor is punched through, thereby providing self-protection against an overvoltage.

SUMMARY OF THE INVENTION

An object of the present invention is to provide an overvoltage self-protection semiconductor device, a method of fabrication thereof and a semiconductor circuit using the same which is capable of accurately securing a breakover voltage of a predetermined value.

Another object of the present invention is to provide an overvoltage self-protection semiconductor device, a method of fabrication thereof and a semiconductor circuit using the same, having a very small temperature dependence of the self-protection voltage.

The prior art disclosed in JP-A-59-172771 described above has the advantage that a portion having a blocking voltage lower than that of the main thyristor is available in the thyristor. The problem of this prior art is that the optimization of the distribution of the impurities concentration in a newly-formed p-base diffusion layer or the radius of curvature of the curved portion which is necessary for securing a predetermined voltage value is difficult. Another problem of this prior art lies in that since the breakdown voltage is determined on the avalanche operating principle, the temperature dependence of the self-protection voltage is so large that an increased operating temperature sometimes causes the breakdown voltage of a portion having a low

2 blocking voltage to reach the original breakdown voltage, thereby making it impossible to attain an overvoltage protection function at a high temperature.

The conventional device disclosed in JP-A-59-158560, on the other hand, utilizes what is called the punch-through phenomenon of the pnp transistor region and has a structure suitable for producing a predetermined voltage. However, the breakover voltage is considerably reduced due to the increased leakage currents at a high temperature.

The present invention is intended to obviate the above-mentioned problems of the prior art devices.

FIGS. 13A to 13C are diagrams for explaining the operating mechanism of a gate trigger according to (PTA Punch Through & Avalanche) operation. The upper part of FIGS. 13A to 13C shows the electric field distribution along the p+, n+, $p_B$, $n_B$ and $P_E$ layers respectively, and the lower part thereof the expansion of a depletion layer in a semiconductor device. By way of explanation, in spite of a depletion layer expanded in each pn junction, only the depletion layers expanding toward the both sides of the main pn junction composed of $p_B$ and $n_B$ are shown. In the state of thermal equilibrium shown in FIG. 13A, where no main voltage is applied, the depletion layers expanding toward both sides of $p_B$ and $n_B$ layers are narrow and low in electric field intensity. With respect to the normal operating voltage shown in FIG. 12, the voltage applied in forward direction corresponds to the voltage shown at point P, which is represented by the area designated as Ap in the electric field intensity distribution. Under this applied voltage, the depletion layer does not reach the n+ layer, and the breakover portion including the p+, n+, $p_B$, $n_B$ and $p_E$ is not operated at all. However, when the applied voltage is increased to a point Q of FIG. 12 of the self-protection voltage corresponding to the area designated as Ao in the electric field intensity distribution shown in FIG. 13C, the depletion layers of $p_B$ and $n_B$ layers expand. Especially, the depletion layer of $p_B$ layer causes a punch through in contact with the n+ layer. In the process, the direction of the electric field in thermal equilibrium of the n+ and $p_B$ layers is opposite to that of the applied voltage, so that the opposite electric field intensity is decreased by the punch through. At the same time, the electric field intensity of the junction including the p+ and n+ layers is considerably increased, thereby causing an avalanche breakdown or zener breakdown. The current that flows in the process makes up a gate trigger current $I_{GT}$ of the thyristor, and the resulting triggering of the thyristor prevents the breakdown of the thyristor under an overvoltage which may be applied thereto. The punch through voltage sharing the high voltage has no temperature dependence, and the breakdown voltage of the p+ and n+ layers subjected to avalanche breakdown or zener breakdown sharing a low voltage is less than 20 volts. The temperature dependence, if any, of these voltages is in the range of at most 2 to 3 volts. This value is negligible compared with an applied voltage of several thousand volts. Thus the semiconductor device according to the present invention substantially eliminates the temperature dependence of the self-protection voltage.

Now, explanation will be made about an example of the method of fabricating a semiconductor device according to the present invention.

FIGS. 14A to 14C are diagrams for explaining the feed forward control by an in-process resistance monitoring according to the present invention. FIG. 14A is a sectional view of a junction formed around a breakover portion according to the present invention, and FIG. 14B a diagram showing the resistance monitoring implemented according to the present invention. The breakover voltage value according to the PTA operation of the present invention is given by an applied voltage value obtained when the $p_B$ layer converts completely to a depletion layer by reverse biasing of the main junction, i.e., $p_B$-$n_B$ junction in an npn structure including n+, $p_B$ and $n_B$ layers. Consequently, the applied voltage value with the $p_B$ layer completely converted to a depletion layer, i.e., the punch through voltage, is determined by the total amount of impurities per unit area of the $p_B$ layer interposed between the n+ and $n_B$ layers. Also, in view of the fact that the total amount of impurities per unit area of the $p_B$ layer is inversely proportional to the resistance, the accurate control of resistance is considered equivalent to the control of the total amount of impurities per unit area. As shown in FIG. 14B, the resistance between spaced p+ layers is measured at the end of forming a junction. In the resistance measurement, the contact resistance is substantially negligible since the probe used for measurement is in contact with the p+ layer. Also, the resistance of the $p_B$ layer under the bottom of the n+ layer is so large compared with the resistance of the $p_B$ layer under the side of the n+ layer or p+ layer that the measurement is taken in real terms of the total amount of impurities per unit area of the $p_B$ layer held between the $n_B$ layer and the bottom of the n+ layer. To the extent that the resistance measurement is covered by a prescribed value set in advance, the process may proceed to the formation of an electrode shown in FIG. 14C. If the measurement is below the prescribed value, however, the process can be advanced to the formation of an electrode shown in FIG. 14C only after adding a heat treatment for repeated resistance measurement and confirming that the prescribed value is covered. The breakover voltage of the overvoltage self-protection semiconductor device fabricated through the above-mentioned processes using the resistance monitoring is 6000 V with fluctuations of less than ±100 V.

The present invention will be explained from a different point of view.

The above-mentioned objects of the present invention are achieved by a semiconductor device comprising a thyristor portion having a pair of main surfaces and formed with at least three semiconductor layers adjacently to each other for supplying a main current, an auxiliary thyristor portion, a pilot thyristor portion and a breakover portion, wherein the breakover portion includes a semiconductor layer of high impurities concentration formed separately in one of the main surfaces and another semiconductor layer of high impurities concentration of opposite conduction type adjacent to said first semiconductor layer, the depletion layer existing in thermal equilibrium at a junction of semiconductor layers of high impurities concentration of mutually opposite conduction types mentioned above is brought into contact with the depletion layer extending into the semiconductor layer and formed in the lower part of the semiconductor layer by application of a forward blocking voltage to the semiconductor device after contacting the lower part of the semiconductor layer of high impurities concentration, whereby an avalanche breakdown or zener breakdown is caused.

More specifically, according to the present invention, there is provided a semiconductor device comprising at least three semiconductor layers having a pair of main surfaces, one of which has a plurality of first semiconductor layers of high impurities concentration of first conduction type (such as $n_E$) formed isolated on a second semiconductor layer (such as $p_B$) adjacent to the lower part thereof, a third semiconductor layer (such as $n_B$) of first conduction type adjacent to the other side of the second semiconductor layer, and a fourth semiconductor layer (such as $p_E$) of second conduction type, which are sequentially formed, the first and fourth semiconductor layers having first and second electrodes (such as cathode and anode) respectively, wherein the first semiconductor layer has a portion not formed with the first electrode, at least a portion of the pn junction having a potential barrier including the particular portion of the first semiconductor layer and the second semiconductor layer contains a plurality of portions not covering a portion of the first semiconductor layer. Such plurality of portions are formed as a second semiconductor layer of high impurities concentration or a fifth semiconductor layer of high impurities concentration of second conduction type formed in isolation. The structure including the first, second, third and fourth semiconductor layers not formed with the first electrode at the first semiconductor layer has a voltage lower than the first withstanding voltage of the structure formed with the first electrode at the first semiconductor layer. The depletion layer extending into the second semiconductor layer reaches the first semiconductor layer, and the electric field intensity at a pn junction having a potential barrier including the first semiconductor layer and the second or fifth semiconductor layers of high impurities concentration formed in isolation as viewed from a main surface is increased, thereby causing a breakdown.

In a semiconductor device according to the present invention, the breakover is caused by a trigger current supplied by the current flowing as a result of the breakdown.

The objects of the present invention are also achieved by a configuration of the above-described structure comprising first and second semiconductor layers electrically connected at a first electrode in order to prevent the malfunction or destruction of the semiconductor device even upon application thereto of a voltage having a high voltage build-up rate.

The above-mentioned objects of the present invention are further achieved by a configuration in which in order to cause a depletion layer to reach the first semiconductor layer or the third electrode at a voltage lower than a first breakdown voltage, the total amount of impurities concentration per unit area and the impurities concentration per unit volume as viewed from a main surface of the second semiconductor layer formed in the depletion layer is smaller than those as viewed from a main surface of another second semiconductor layer, thereby considerably increasing the controllability of the breakover voltage.

The above-mentioned objects are further achieved by a method of fabricating an overvoltage self-protection semiconductor device comprising the steps of forming a second semiconductor layer of second conduction type on one main surface of a semiconductor substrate of first conduction type, forming a fourth semiconductor layer of second conduction type on the other main surface of the semiconductor substrate of first conduction type, selectively removing the second semiconductor layer from the one main surface to a predetermined depth in such a manner as to selectively form an isolated surface of the second semiconductor layer, forming a first semiconductor layer of first conduction type of high impurities concentration from the one main surface, selectively removing the first semiconductor layer from the one main surface in such a manner as to isolate the first semiconductor layer into a plurality of portions, measuring the sheet resistivity of the second semiconductor layer between the first semiconductor layer of first conduction type of high impurities concentration and the semiconductor substrate of first conduction type, at a point between the second semiconductors exposed with the first semiconductor layer selectively removed of the second semiconductor layer remaining after being removed to a predetermined depth, heat treating the assembly to obtain a predetermined sheet resistivity, forming a first electrode in such a manner as to have a portion electrically connected to a portion of the second semiconductor layer exposed with the first semiconductor layer selectively removed and one of the portions into which the first semiconductor layer is isolated, and forming a second electrode electrically connected to the fourth semiconductor layer of second conduction type on the other main surface.

The above-mentioned objects are further achieved by a method of fabricating an overvoltage self-protection semiconductor device comprising the steps of forming a second semiconductor layer of second conduction type on one main surface of a semiconductor substrate of first conduction type, forming a fourth semiconductor layer of second conduction type on the other main surface, selectively removing the second semiconductor layer to a predetermined depth from the one main surface in such a manner as to selectively form an isolated surface of the second semiconductor layer, forming a first semiconductor layer of first conduction type of high impurities concentration from the one main surface, removing the first semiconductor layer selectively from the one main surface in such a manner as to isolate the first semiconductor layer into a plurality of portions, forming a fifth semiconductor layer of second conduction type of high impurities concentration at a portion of the second semiconductor layer exposed with the first semiconductor layer selectively removed, measuring the sheet resistivity of the second semiconductor layer remaining after selective removal to a predetermined depth between the semiconductor substrate of first conduction type and the first semiconductor layer of first conduction type of high impurities concentration, at a point between the fifth semiconductor layers of high impurities concentration formed in isolation, heat treating the assembly to obtain a predetermined sheet resistivity, forming a first electrode having a portion electrically connected to one of the portions into which the first semiconductor layer is isolated and a portion of the second semiconductor layer exposed with the first semiconductor layer selectively removed, and forming a second electrode electrically connected to the fourth semiconductor layer of second conduction type on the other main surface.

The above-mentioned objects are further achieved by a configuration of a power converter using a plurality of overvoltage self-protection semiconductor devices for converting AC into DC power according to the present invention in order to decrease the size and increase the capacity of the power converter.

The above-mentioned objects are further achieved by a configuration of a power converter using a plurality of overvoltage self-protection semiconductor devices for converting DC into AC power according to the present invention in order to decrease the size and increase the capacity of the power converter.

The above-mentioned objects are further achieved by a configuration of a power converter using a plurality of overvoltage self-protection semiconductor devices for converting AC power of first frequency into AC power of second frequency according to the present invention in order to decrease the size and increase the capacity of the power converter.

The above-mentioned objects are achieved further by a configuration of a DC power transmission system including a combination of a plurality of power converters each including a plurality of overvoltage self-protection semiconductor devices for converting AC into DC power and DC into AC power according to the present invention in order to decrease the size and increase the capacity of the power converters.

The above-mentioned objects are further achieved by a configuration of a static var compensator using a plurality of overvoltage self-protection semiconductor devices according to the present invention in order to decrease the size and increase the capacity of the static var compensator (for reactive power).

According to an aspect of the present invention, there is provided an overvoltage self-protection semiconductor device in which a part of a second semiconductor layer is formed in high impurities concentration or the second semiconductor layer and the fifth semiconductor layer of high impurities concentration are formed adjacently to each other in a first pn junction including the first semiconductor layer and the second semiconductor layer not in contact with a first main electrode, and therefore upon application of a predetermined high voltage lower than the breakdown voltage at a portion including the first, second, third and fourth semiconductor layers formed with the first electrode, the second semiconductor region at a portion not in contact with the first main electrode is punched through so that the electric field intensity at the first pn junction including the first semiconductor layer and the fifth semiconductor layer or the second semiconductor layer of high impurities concentration is capable of being increased to cause a breakdown at the particular portion. The current supplied by this breakdown is used as a trigger current for a pilot thyristor.

According to another aspect of the present invention, in order to prevent a semiconductor device from malfunction or destruction even when a voltage with high voltage build-up rate is applied thereto, the above-mentioned structure has a portion where the first semiconductor supplied with the main current is partially shorted with the second semiconductor layer in such a manner that the first semiconductor layer is electrically connected with the second semiconductor layer at the first main electrode. Therefore, a displacement current can be flowed through a bypass composed of a shorting resistor, thus preventing the destruction even upon application of a voltage with high build-up rate.

According to a further aspect of the present invention, in order to cause a depletion layer to reach the first semiconductor layer or the third electrode with a voltage lower than the first breakdown voltage, the impurities concentration per unit volume and the total amount of impurities concentration per unit area as viewed from one main surface of a second semiconductor layer formed with the depletion layer are kept smaller than the impurities concentration per unit volume and the total amount of impurities concentration per unit area as viewed from one main surface of another second semiconductor layer. The impurities concentration per unit volume and the total amount of impurities concentration per unit area on the second semiconductor layer formed with the depletion layer are accurately determined by measuring the sheet resistivity between the fifth semiconductor layers or the second semiconductor layers of high impurities concentration formed in isolation as viewed from a main surface.

For this reason, the impurities concentration per unit volume and the total amount of impurities concentration per unit area on the second semiconductor layer formed with a depletion layer can be controlled in such a manner that the sheet resistivity between the fifth semiconductor layers or the second semiconductor layers of high impurities concentration formed in isolation as viewed from one main surface is covered by a predetermined range in a fabrication process before forming an electrode, thereby considerably improving the controllability of the breakover voltage in a predetermined voltage range lower than the first breakdown voltage.

According to the present invention, it is thus possible to considerably improve the productivity, i.e., the controllability of the processes for fabricating an overvoltage self-protection semiconductor device using the current flowing by breakdown as a trigger current after the above-mentioned punch-through.

According to a still further aspect of the present invention, there is provided a semiconductor circuit for a static var compensator, a power converter apparatus for a DC power transmission system, etc. using an overvoltage self-protection semiconductor device according to the present invention, comprising a combination of a power converter for converting AC into DC power and a power converter for converting DC into AC power, a power converter for converting AC power of first frequency into AC power of second frequency, a power converter for converting AC into DC power and a power converter for converting DC into AC power.

Generally, the above-mentioned power converter circuits have so far required a multiplicity of thyristors in series connection, which in turn requires elements sufficient in number to cover the margin of voltage unbalance between the series-connected elements. In a power converter using an overvoltage self-protection semiconductor device with a uniform breakover voltage according to the present invention, the margin is reduced resulting in a greatly reduced number of required elements considerably reducing the system size. Further, the very small voltage unbalance between series-connected elements makes it possible to use a great number of elements in series, thereby improving the capacity of a power converter.

Although the foregoing explanation deals with an embodiment in which a p-base layer and an n-emitter layer are formed in a semiconductor substrate, the p-base layer and the n-emitter base may alternatively be formed by epitaxial growth.

As explained above, according to the present invention, there is provided an overvoltage self-protection semiconductor device having a very small fluctuation of the breakover voltage with temperature and very small variations in breakover voltage set at a predetermined value, in which self-protection from overvoltage is positively effected over a wide temperature range without being affected by the operating temperature, as well as a method of fabrication of the semiconductor device, and semiconductor circuits using such semiconductor devices.

DESCRIPTION OF THE PREFERRED EMBODIMENTS

An overvoltage self-protection semiconductor device, a method of fabrication thereof and a semiconductor circuit using such a device according to an embodiment of the present invention will be described in detail below with reference to the accompanying drawings.

Figure 1:
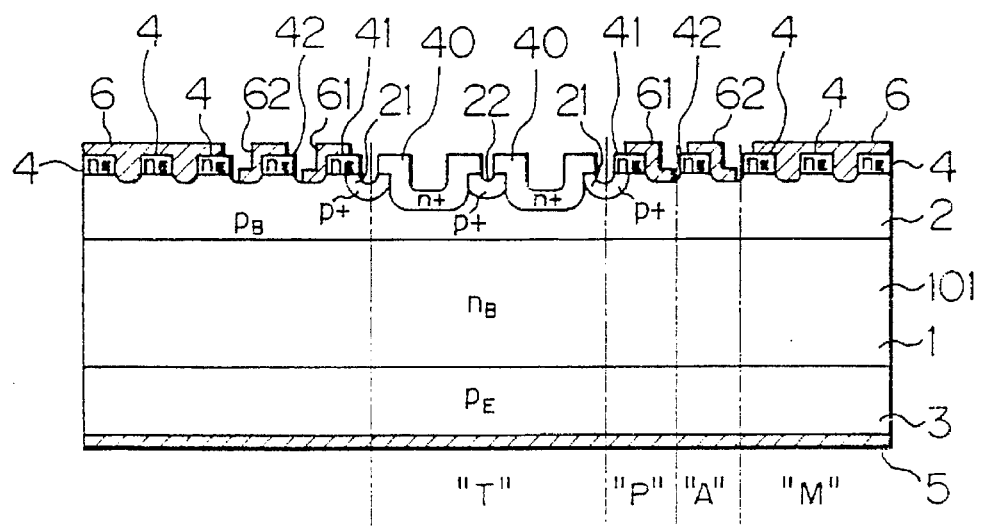
FIG. 1 is a sectional view showing an embodiment of an overvoltage self-protection semiconductor device according to the present invention.
Figure 2:
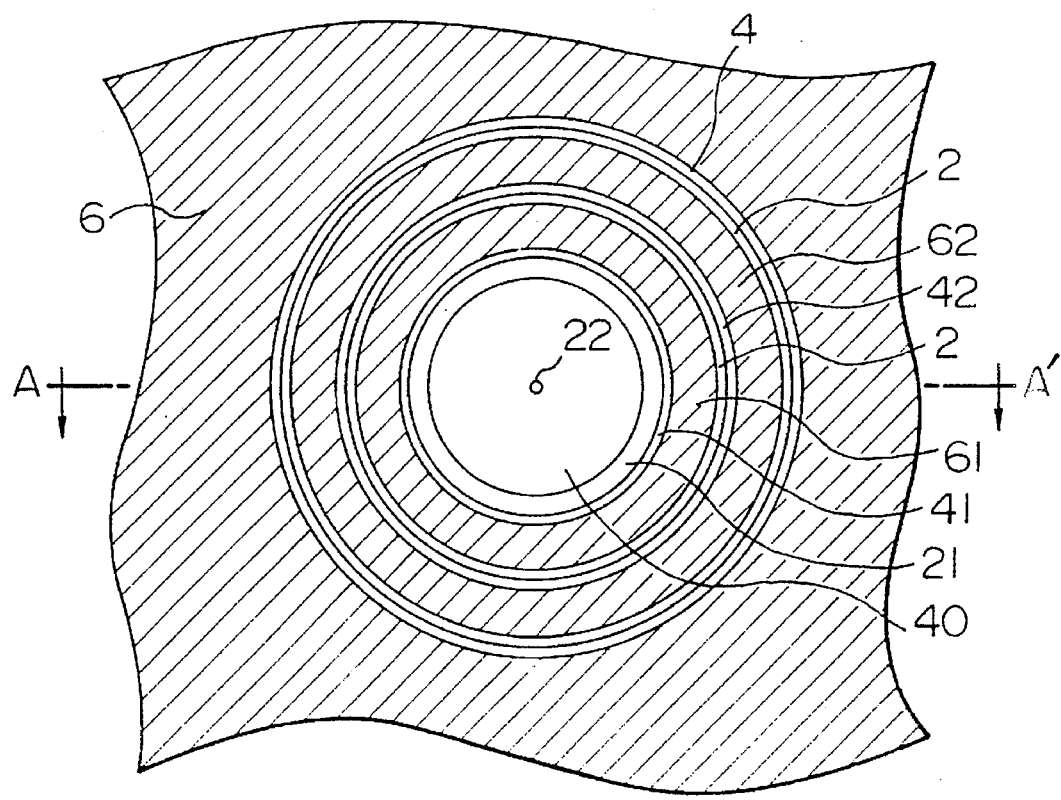
FIG. 2 is a plan view showing an embodiment of an overvoltage self-protection semiconductor device according to the present invention.
Figure 3:
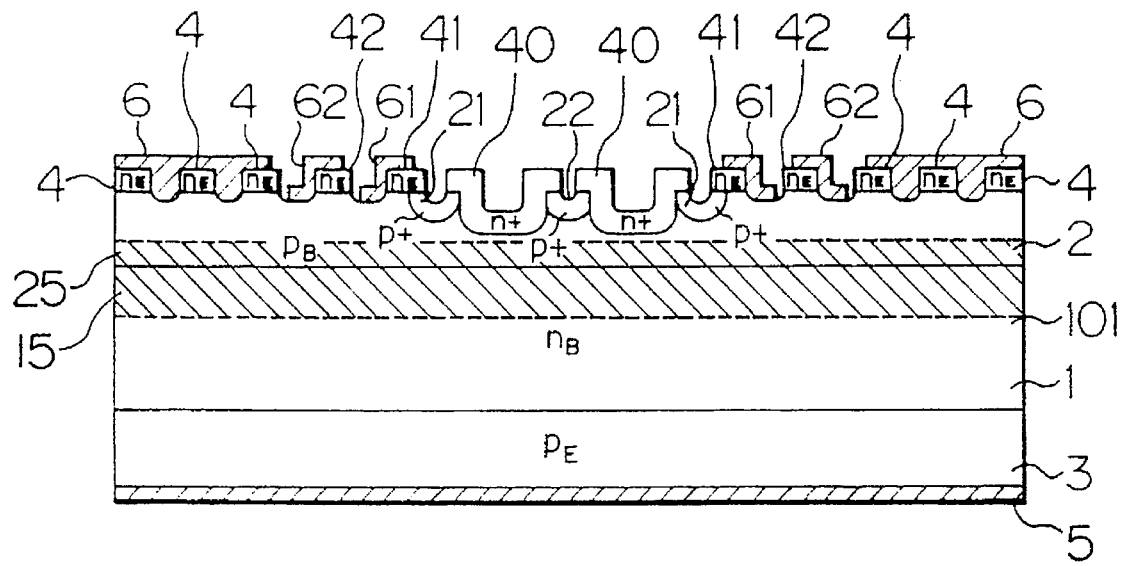
FIG. 3 is a diagram for explaining the operation with a low applied voltage.
Figure 4:
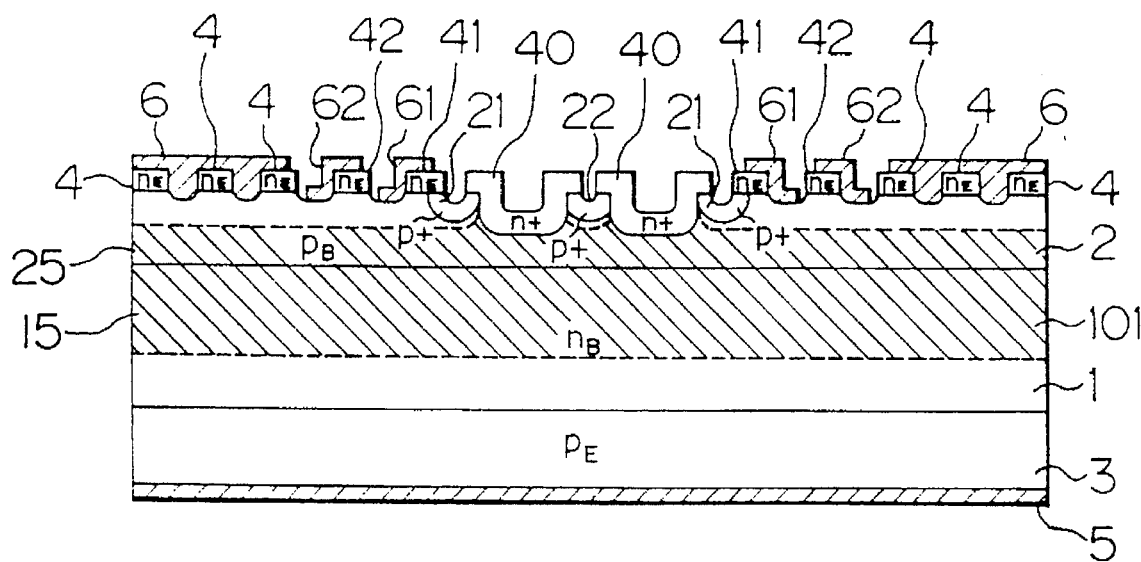
FIG. 4 is a diagram for explaining the operation with a high applied voltage.
Figure 5:
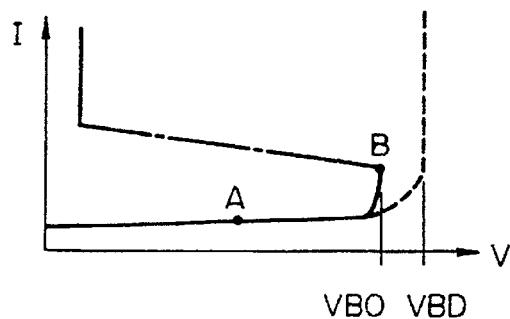
FIG. 5 is a diagram for explaining the reverse current-voltage characteristic according to an embodiment of the present invention.

FIG. 1 is a sectional view showing an embodiment of an overvoltage self-protection semiconductor device according to the present invention, FIG. 2 is a plan view thereof, FIG. 3 a diagram for explaining the operation with a low applied voltage, FIG. 4 a diagram for explaining the operation with a high applied voltage, and FIG. 5 is a diagram for explaining the reverse current-voltage characteristic according to an embodiment of the present invention. The semiconductor device shown in FIG. 1 comprises a semiconductor substrate 101 and corresponding of electrodes. More specifically, in FIGS. 1 to 4, reference numeral 1 designates an n-base layer, numeral 2 a p-base layer, numeral 3 a p-emitter layer, numerals 4, 41, 42 n-emitter layers, numeral 5 an anode, numerals 6, 61, 62 cathodes, numerals 21, 22 p+ layers, character M a main thyristor portion, character A an auxiliary thyristor portion, character P a pilot thyristor portion and character T a breakover portion.

An overvoltage self-protection semiconductor device according to an embodiment of the present invention, as shown in FIG. 1, comprises the main thyristor portion M, the auxiliary thyristor portion A, the pilot thyristor portion P and the breakover portion T.

The main thyristor portion M is one in which the main current of an overvoltage self-protection semiconductor device flows, and comprises four semiconductor layers including an n-emitter layer 4 making up a first semiconductor layer, a p-base layer 2 making up a second semiconductor layer, an n-base layer 1 making up a third semiconductor layer, a p-emitter layer 3 making up a fourth semiconductor layer, an anode 5 connected to the p-emitter layer, and a cathode 6 connected to the n-emitter layer by being partially shorted to the p-base layer 2.

The auxiliary thyristor portion A has four semiconductor layers including an n-emitter layer 42, a p-base layer 2, an n-base layer 1 and a p-emitter layer 3, an anode 5, and a cathode 62 partially shorted to the p-base layer 2.

The pilot thyristor portion P includes four semiconductor layers including a n-emitter layer 41, a p-base layer 2, an n-base layer 1 and a p-emitter layer, an anode 5, and a cathode 61 partially shorted to the p-base layer 2.

Further, the breakover portion T provides a portion supplied with a current upon application thereto of a voltage for triggering the pilot thyristor P, and comprises six semiconductor layers including an n+ layer 40 having a high impurities concentration, a p+ layer 21 making up a fifth semiconductor layer formed in contact with the n+ layer 40, a p+ layer 22, a p-base layer 2, an n-base layer 1 and a p-emitter layer, and an anode 5.

The sectional view of an overvoltage self-protection semiconductor device according to an embodiment of the present invention shown in FIG. 1 is taken along line A–A' in the plan view of FIG. 2. A semiconductor device according to an embodiment of the present invention comprises, as shown in FIG. 2, the breakover portion T, the pilot thyristor portion P, the auxiliary thyristor portion A and the main thyristor portion M arranged concentrically with the breakover portion T as a center in order to assure uniform expansion of the current supplied by turning on of the device.

Now, explanation will be made about the operating principle of an overvoltage self-protection semiconductor device according to an embodiment of the present invention with reference to FIGS. 3 to 5. In FIGS. 3 and 4, numerals 25, 15 designate depletion layers extending to the p-base layer 2 and the n-base layer 1 upon application thereto of a forward blocking voltage.

FIG. 3 shows the expansion of the depletion layer when the cathode 6 is negative and the anode 5 positive in polarity with a forward voltage applied thereto, and the applied voltage does not reach a predetermined breakover voltage. FIG. 4 shows the expansion of the depletion layer when the cathode is negative and the anode 5 positive in polarity with a forward voltage applied thereto, and the applied voltage has reached a predetermined breakover voltage.

Though not shown in the drawings, the junction of the n+ layer 40 and the p+ layer 21 has a depletion layer in thermal equilibrium. Further, the p+ layer 22 is "floated", and therefore there exists a depletion layer but not any strong electric field in the junction of the p+ layer 22 and the n+ layer 40.

Assuming that a semiconductor device configured as shown in FIGS. 1 and 2 is impressed with a forward voltage, the depletion layer 25 extends in the p-base layer 2 with the increase in the applied voltage as shown in FIG. 3. With a further increase in the applied voltage, the depletion layer 25 reaches the bottom of the n+ layer 40 as shown in FIG. 4. Subsequently, a slight increase in the applied voltage brings the depletion layer 25 into contact with another depletion layer in thermal equilibrium of a pn junction including the n+ layer 40 and the p-base layer 2, followed further by contacting a depletion layer existing in a junction of the n+ layer 40 and the p+ layer 21. As a result, the electric field intensity of the n+ layer 40 and the p+ layer 21 increases considerably, thereby causing an avalanche breakdown or a zener breakdown at the particular portion.

The current due to the avalanche breakdown provides a base current of the pilot thyristor portion P, and thus the pilot thyristor portion P is fired.

In the diagram of FIG. 5 for explaining the current-voltage characteristic, the voltage values at points A and B correspond to a voltage level at which the semiconductor device enters the states shown in FIGS. 3 and 4. More specifically, in the case where the forward voltage (point A) applied to the semiconductor device is lower than a predetermined breakover voltage VBO, the depletion layer 25 extending in the p-base layer 2 does not reach the n+ layer 40, with the pilot thyristor P remaining off. When the forward voltage applied to the semiconductor device reaches a predetermined breakover voltage (point B), the depletion layer 25 extending in the p-base layer 2 reaches the n+ layer 40, so that a subsequent slight increase in the applied voltage causes the depletion layer 25 to come into contact with another depletion layer existing in thermal equilibrium of a pn junction including the n+ layer 40 and the p+ layer 21. As a consequence, the electric field intensity between the n+ layer 40 and the p+ layer 21 considerably increases, and causes an avalanche breakdown or zener breakdown, thereby supplying a current to the breakover portion T.

This current caused by the avalanche breakdown or zener breakdown makes up a base current for the pilot thyristor portion P and turns on the pilot thyristor portion P shown in FIG. 1. With the turning on of the pilot thyristor P, a multiplicity of holes providing an anode are injected from the p-emitter layer 3. When this hole current flows from the pilot thyristor portion P shown in FIG. 1 to the main thyristor M, this current makes up a base current for the auxiliary thyristor portion A, thereby turning on the auxiliary thyristor portion A. In the similar way, when the auxiliary thyristor A turns on, the main thyristor portion M is turned on.

Apart from the embodiment of the present invention described above comprising only one auxiliary thyristor A, there may be provided a plurality of auxiliary thyristors as required.

The present invention desirably has a pilot thyristor, although only the overvoltage protection portion, the auxiliary thyristor portion and the main thyristor portion achieves the similar effect as the present invention mentioned above. Further, the present invention desirably has the pilot thyristor portion and the auxiliary thyristor portion, although only the overvoltage protection portion and the main thyristor portion achieve the similar effect.

FIGS. 6A to 6F are longitudinal sectional views showing main processes for fabricating an overvoltage self-protection semiconductor device according to an embodiment of the present invention described above. A method of fabricating a semiconductor device according to an embodiment of the present invention described above will be explained with reference to FIGS. 6A to 6F.

Figure 6A:
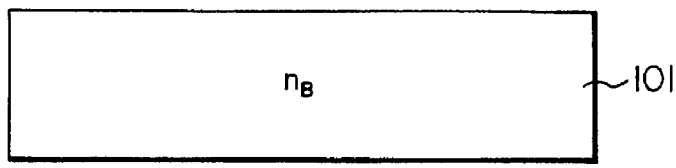
FIGS. 6A to 6F are longitudinal sectional views showing main fabrication steps for explaining the fabrication process.
Figure 6B:
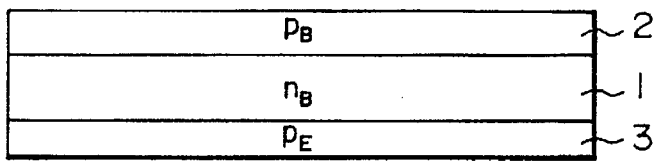

(1) First, a high-resistance n-type semiconductor substrate 100 with a resistivity of 350 Ω.cm is prepared, and aluminum providing a p-type impurities is diffused from the two main surfaces. The surface impurities concentration is set to about the 16th power of $1 \times 10$ ($1 \times 10^{16}/cm^3$) and the depth of diffusion to about 150 micrometers. In the process, the p-type impurities layer on cathode side providing a p-base layer 2 is adjusted in thickness by etching to a sheet resistivity of about 800 to 900Ω per unit area under the last n-emitter layer (FIGS. 6A to 6B).

Figure 6C:
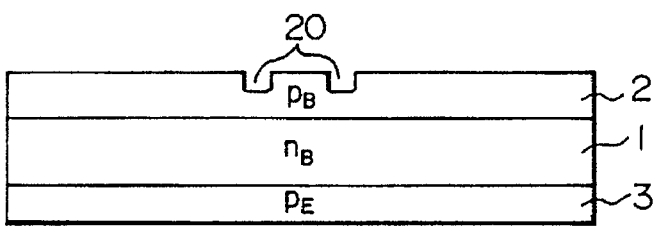

(2) In the next step, an annular etched region 20 is formed by photo-etching from the surface of the p-type semiconductor layer 2 providing a p-base layer. The etched region 20 has an outer diameter of about 1.5 millimeters, an inner diameter of about 0.5 millimeters, a depth of about 45 micrometers from the pn junction including the central p-type semiconductor layer 2 and the n-type semiconductor layer 1 (FIG. 6C).

Figure 6D:
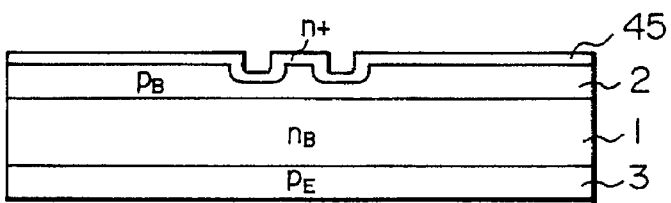

(3) Subsequently, an n-type semiconductor layer 45 of high surface impurities concentration of about the 19th to 21st power of $1\times10$ ($1\times10^{19}$ to $1\times10^{21}/cm^3$) per unit volume is formed in the depth of about 8 micrometers by diffusion of P (phosphorus) using $POCl_3$ from the surface formed with the etched region 20 (FIG. 6D).

Figure 6E:
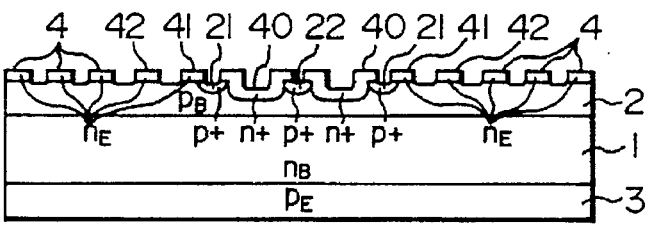

(4) In the next step, a planar pattern is formed on the cathode side. More specifically, the n-emitter layer 4 of the main thyristor portion M, the n-emitter layer 42 of the auxiliary thyristor portion A, the n-emitter layer 41 of the pilot thyristor portion P and the n+ layer 40 of the breakover portion T are isolated with the n+ layer 40 of the central portion of the breakover portion T removed by etching. Further, p-type semiconductor layers 21 and 22 of high p-type impurities concentration of about 18th to 20th power of $1\times10$ per $cm^3$ ($1\times10^{18}$ to $1\times10^{20}/cm^3$) are formed in the etched region of the n+ layer 40 at the central portion of the n+ layer 40 of the breakover portion T and the etched region at least between the n-emitter layer 41 of the pilot thyristor portion P and the n+ layer 40 of the breakover portion T (FIG. 6E).

The breakover voltage of an overvoltage self-protection semiconductor device according to an embodiment of the present invention, as explained with reference to FIGS. 3 and 4, is determined by the fact that with the increase in the forward applied voltage, the depletion layer 2 extending in the p-base layer 2 reaches the bottom of the n+ layer 40, and a subsequent slight increase in the applied voltage brings the depletion layer 25 into contact with another depletion layer in thermal equilibrium of a pn junction including the n+ layer 40 and the p+ layer 21. As a result, the electric field intensity of the n+ layer 40 and the p+ layer 21 considerably increases, thereby leading to an avalanche breakdown or zener breakdown, so that the resulting breakdown current providing a base current fires the pilot thyristor P.

More specifically, in setting the breakover voltage to a predetermined level, it is necessary to set the sheet resistivity, i.e., the total amount of impurities per unit area of the p-base layer between the n+ layer 40 and the n-base layer 1 to a predetermined value. When the breakover voltage is set to 6000 V, for example, a sheet resistivity of about 15 k$\Omega$ per unit area is sufficient, although control of the sheet resistivity is important.

In a method of fabrication according to the present invention, the current-voltage characteristic between the p-type semiconductor layers 21 and 22 of high impurities concentration is measurable, and the sheet resistivity is easily determined while improving the controllability considerably by the current-voltage characteristic measured as above. As a more specific example, a measurement of sheet resistivity under the condition specified in FIG. 6E is 14.8 k$\Omega$ per unit area, and the sheet resistivity is controllable in the range of ±1% against 15 k$\Omega$ by heat treatment for mere 30 minutes at 1150° C.

Figure 6F:
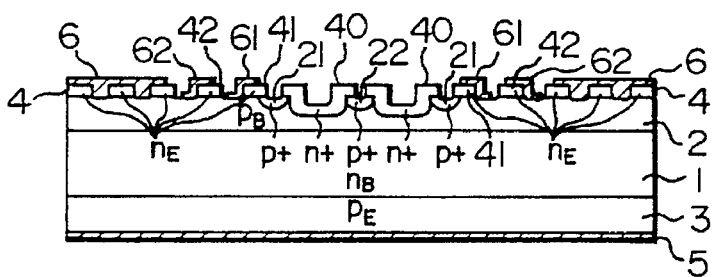

(5) The process of forming all the semiconductor layers by the processes mentioned above is followed by forming an anode 5 connected to the p-emitter layer 3 on anode side, a cathode 6 connected to the n-emitter layer 4 by being partially shorted to the p-base layer 3 of the main thyristor portion M on cathode side, a cathode 62 partially shorted to the p-base layer 2 of the auxiliary thyristor portion A, and a cathode 61 partially shorted to the p-base layer 2 of the pilot thyristor portion P by the well-known process of aluminum vapor evaporation and photoetching. Finally, the edge of the wafer is processed by the well-known beveling technique, after which a surface-passivating film is coated thereby to complete a semiconductor device according to the present invention (FIG. 6F).

The breakover voltage of an overvoltage self-protection semiconductor device fabricated through the above-mentioned processes is 6000 V with fluctuations of not more than ±100 V.

The dimensions of the semiconductor devices and the impurities concentrations and resistance values thereof used for explanation of the fabrication processes are an example, and should not be considered limitative.

A semiconductor device according to an embodiment of the present invention, though explained above as comprising the p-type semiconductor layers 21 and 22 of high impurities concentration for convenience sake to facilitate the understanding of the principle, has a p-base layer thereof capable of being formed normally by the diffusion process with the surface thereof often high in impurities concentration. In the case where the surface of the p-base layer is high in impurities concentration, therefore, the p-type semiconductor layers 21 and 22 of high impurities concentration are not always required, with a p-base layer having a surface of high impurities concentration operating equivalently to the p-type semiconductor layers 21 and 22 of high impurities concentration.

Figure 6G:
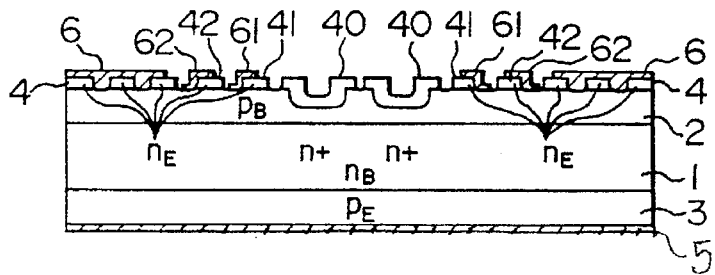
FIG. 6G is another embodiment of FIG. 6F.

FIG. 6G shows an overvoltage self-protection semiconductor device in which the surface of P base layer 2 has high impurity concentration. In other words, FIG. 6G shows another embodiment of FIGS. 6E and 6F in which the p-type semiconductor layers 21 and 22 are eliminated.

Now, explanation will be made about a planar-type thyristor to which the present invention is applied.

Figure 15A:
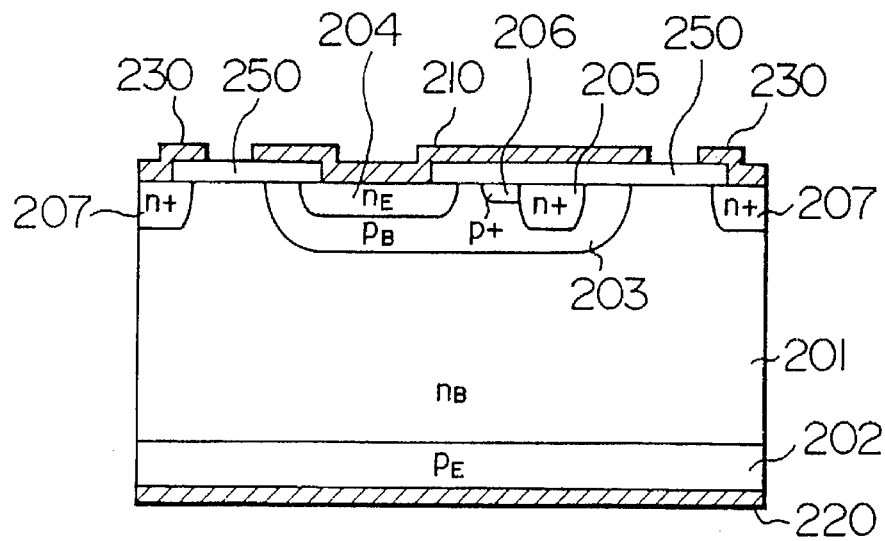
FIGS. 15A to 15C are diagrams for explaining a planar-type thyristor according to the present invention.
Figure 15B:
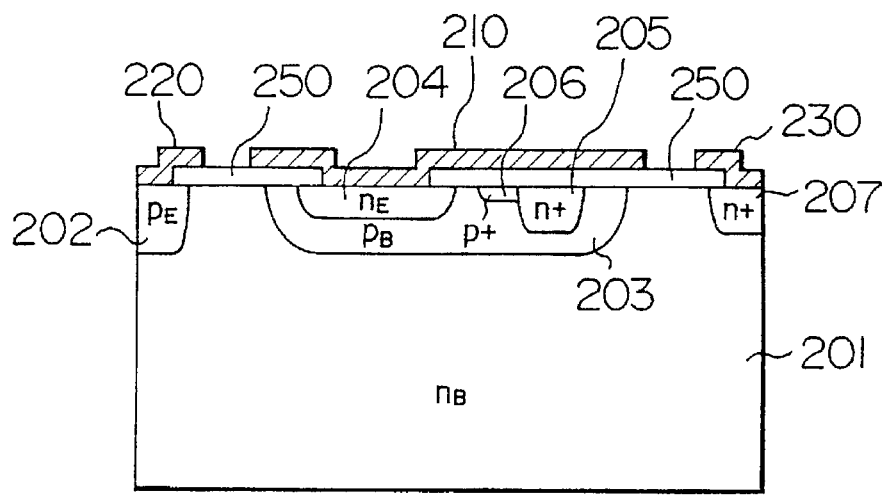
Figure 15C:
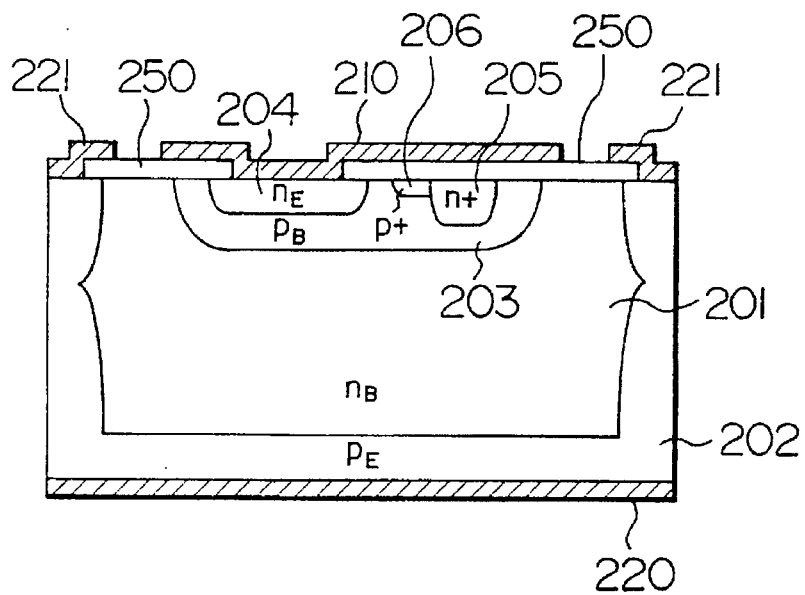

FIGS. 15A to 15C show embodiments in which the PTA method according to the present invention is applied to a planar-type thyristor. In FIG. 15A, a main thyristor includes a p-emitter layer 202, an n-base layer 201, a p-base region 203, an n-emitter region 204, an anode 220 in ohmic contact with the p-emitter region 202, and a cathode 210 in ohmic contact with the n-emitter region 204. This thyristor is of planar structure with a main junction including the p-base region 203 and the n-base layer 201 exposed to one main surface for maintaining the breakdown voltage of the thyristor. An n+ region 205 of high impurities concentration and a p+ region 206 of high impurities concentration in contact with the n+ region 205 according to the present invention are formed in the p-base region 203. Numeral 207 designates an n+ layer as a channel stopper normally used around the chip. This n+ layer 207 has a channel stopper electrode 230 formed therein. Numeral 250 designates an insulating film formed as a surface protection film and configured of $SiO_2$ or PSG film. Under the normal forward blocking condition, the potential of the electrode 230 is substantially equal to that of the anode 220. Explanation will be made about the operation of this thyristor.

Upon application to the thyristor of a forward voltage with the anode 220 positive and the cathode 204 negative in polarity, a depletion layer expands on the sides of a main junction including the p-base emitter region 203 and the n-base layer 201. When the applied voltage reaches a predetermined self-protection voltage level, the p-base region 203 held between the n+ region 205 and the n-base layer 201 becomes a depletion layer, so that an npn section including the n+ region 205, the p-base region 203 and the n-base layer 201 causes a punch-through. This punch-through is followed by an increase in electric field intensity at a pn junction including the n+ region 205 and the p+ region 206, thereby causing an avalanche breakdown. The current generated by the avalanche breakdown flows to the p-base region 203 thereby to trigger a main thyristor including the p-emitter region 202, the n-base region 201, the p-base region 203 and the n-emitter region 204. The main thyristor is thus fired. FIG. 15B shows an embodiment representing an application with the p-emitter region 202 formed in the same plane as the cathode region 204. FIG. 15C shows an embodiment with the p-emitter region 202 connected from one and the other main surfaces by means of impurities having a large diffusion coefficient such as aluminum. Numeral 221 designates an anode formed in the surface. In FIGS. 15B and 15C, reference numerals designate the same component parts as the corresponding reference numerals in FIG. 15A.

Various semiconductor circuits using a semiconductor device according to the present invention will be described.

Figure 7:
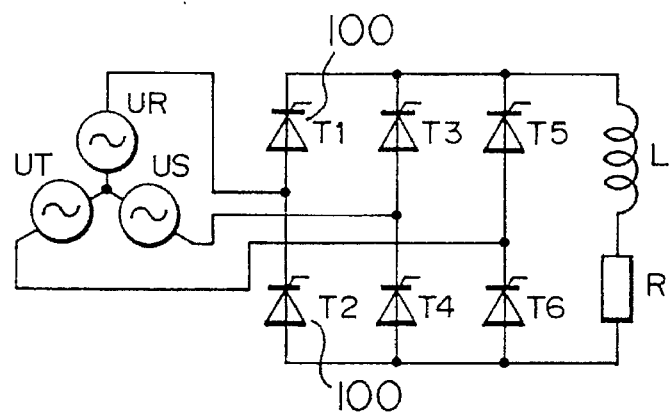
FIG. 7 is a diagram showing an example of configuration of a separately excited rectifier circuit.

FIG. 7 is a diagram showing an example of a semiconductor circuit with which an overvoltage self-protection semiconductor device is applied to a separately-excited rectifier circuit according to the present invention. In FIG. 7, reference characters UR, US, UT designate three-phase AC voltages, T1, T3, T5 switches for the upper arm, T2, T4, T6 switches for the lower arm, and numeral 100 an overvoltage self-protection semiconductor device.

The separately-excited rectifier circuit shown in FIG. 7 includes switches each made up of a single or a plurality of overvoltage self-protection semiconductor devices 100 in series connection. This three-phase bridge rectifier circuit is adapted to convert a three-phase AC voltage UR, US, UT into a DC voltage and supplies the converted voltage to a load including a load inductance L and a load resistor R.

Figure 8:
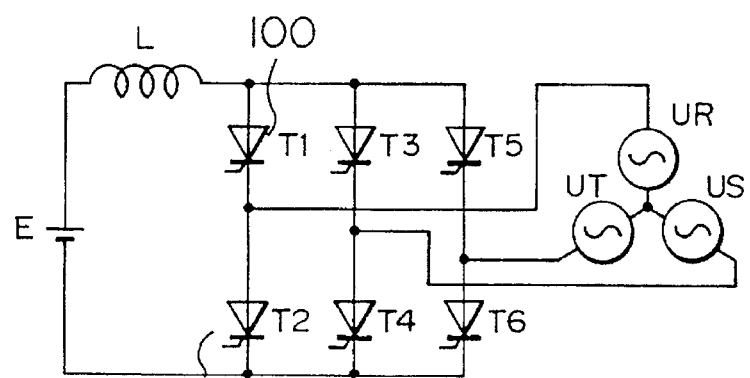
FIG. 8 is a diagram showing an example of configuration of a separately excited inverter.

FIG. 8 is a diagram showing an example of a semiconductor circuit for an overvoltage self-protection semiconductor device as applied to a separately-commutated inverter according to the present invention. In FIG. 8, reference character E designates a DC power supply, character L a DC reactor and the other reference numerals and characters designate the same component parts as the corresponding numerals and characters in FIG. 7.

The separately-excited inverter shown in FIG. 8 has switches each including a single or a plurality of overvoltage self-protection semiconductor devices 100 connected in series. This inverter is capable of converting a DC power supply E to three-phase AC voltages UR, US, UT by a circuit configured of overvoltage self-protection semiconductor devices according to the present invention as a switch in the form of three-phase bridge.

Figure 9:
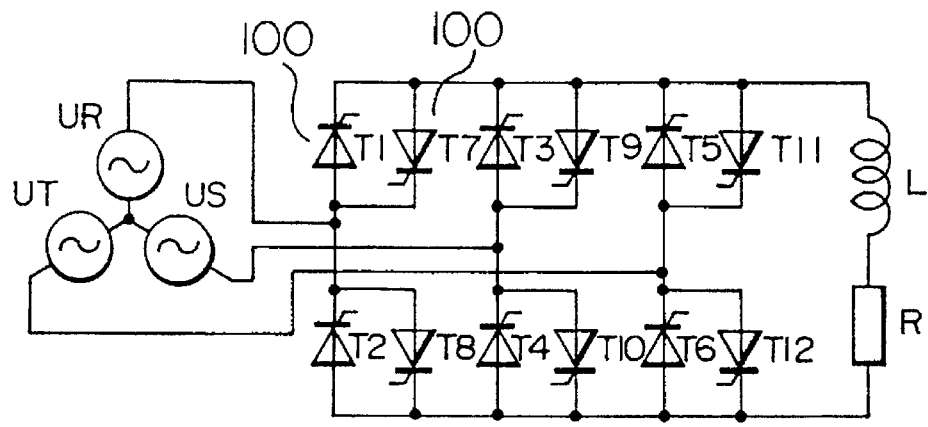
FIG. 9 is a diagram showing an example of configuration of a separately excited cycloconverter.

FIG. 9 is a diagram showing an example of a semiconductor circuit with an overvoltage self-protection semiconductor device according to the present invention as applied to an externally-commutated cycloconverter.

This semiconductor circuit comprises a single or a plurality of overvoltage self-protection semiconductor devices 100 connected in series as switches T1, T3, T5, T2, T4, T6 configured of positive-group converters, and a single or a plurality of overvoltage self-protection semiconductor devices 100 connected in series as switches T7, T9, T11, T8, T10, T12 configured of negative-group converters.

This externally-commutated cycloconverter, with a three-phase bridge rectifier circuit in antiparallel connection, is capable of controlling the output waveform in such a manner as to produce a sine-wave output voltage-current, thus converting an input AC frequency into an AC power with an output frequency one third or one sixth of the input frequency.

Figure 10:
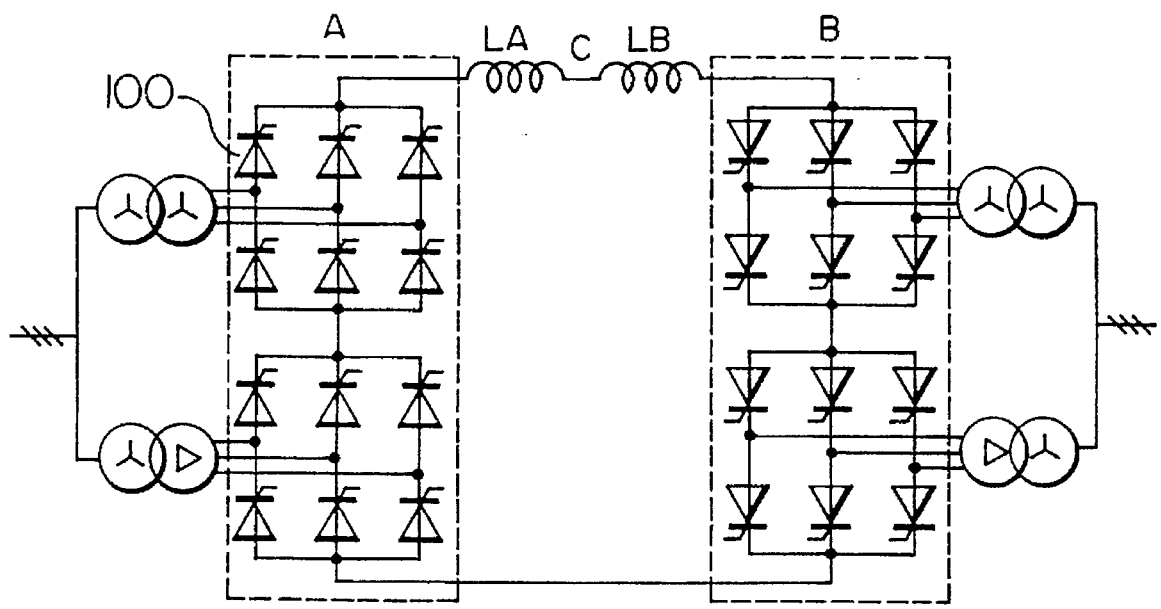
FIG. 10 is a diagram showing an example of configuration of a circuit for DC power transmission.

FIG. 10 is a diagram showing an example of a semiconductor circuit with an overvoltage self-protection semiconductor device according to the present invention applied to a high-voltage DC transmission. In FIG. 10, characters "A" and "B" designate a HVDC converting station, "LA" and "LB" a DC reactor, and "C" a DC power transmission line.

In FIG. 10, the power converted from AC to DC at the HVDC converting station A is smoothed as a pulsated current by the DC reactor LA, and is sent to the HVDC converting station B by a DC power transmission line. The HVDC converting station B transmits power to an AC system by converting DC power into AC power.

Figure 11:
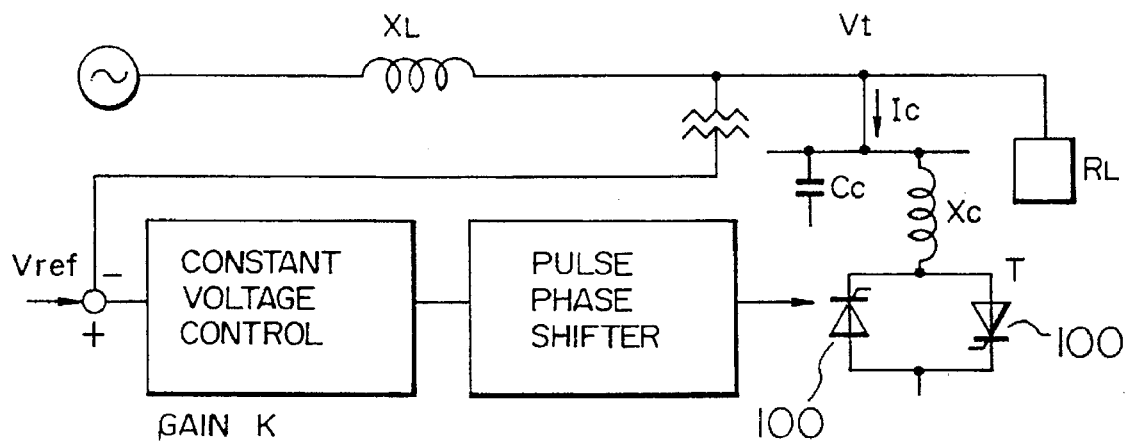
FIG. 11 is a diagram showing an example of configuration of a static var compensator (for reactive powers)
Figure 12:
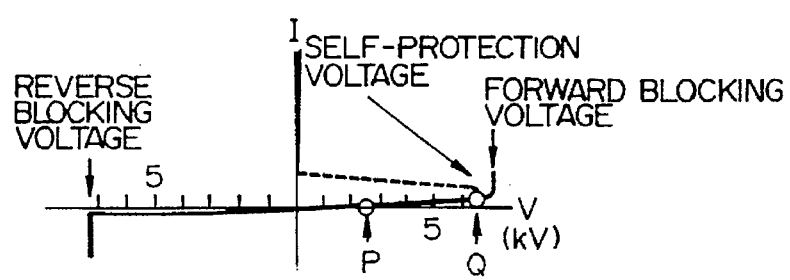
FIG. 12 is a diagram for explaining the I–V (current-voltage) characteristic of a VBO-free light triggered thyristor.
Figure 13A:
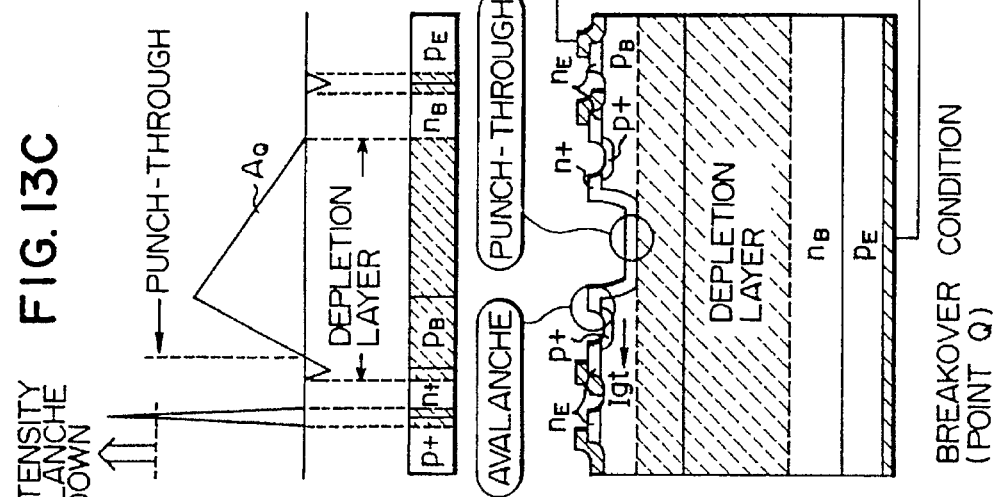
FIGS. 13A to 13C are diagrams for explaining the gate trigger mechanism of a PTA (Punch Through & Avalanche) semiconductor device.
Figure 13B:
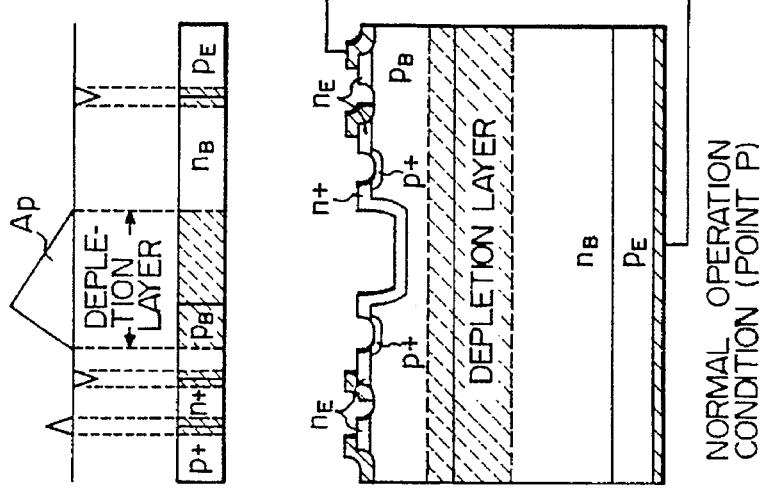
Figure 13C:
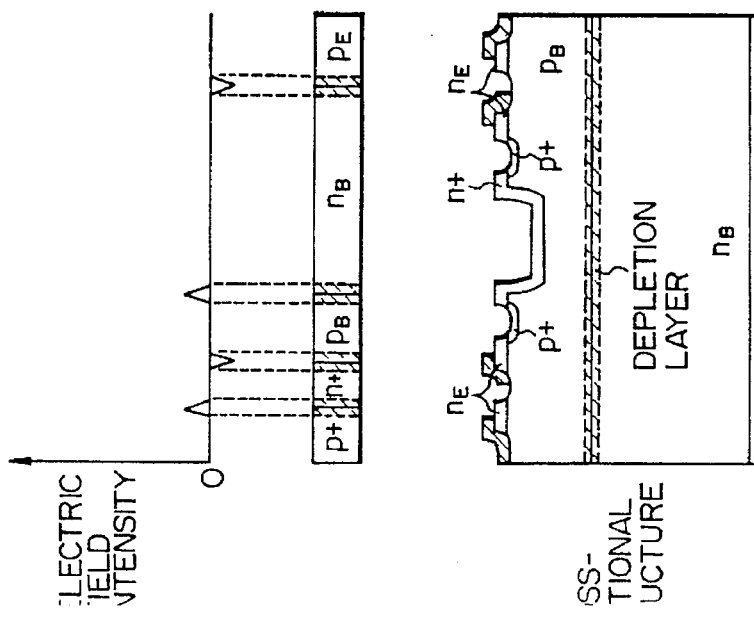
Figure 14C:
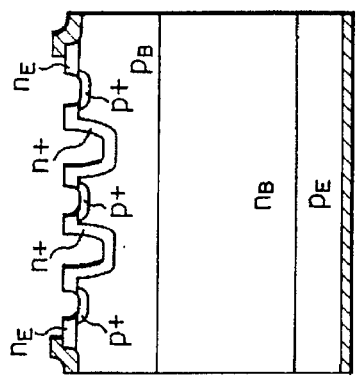
FIGS. 14A to 14C are diagrams for explaining the feed forward control of in-process resistance monitoring as an example of the method of fabrication of a semiconductor device according to the present invention.
Figure 14B:
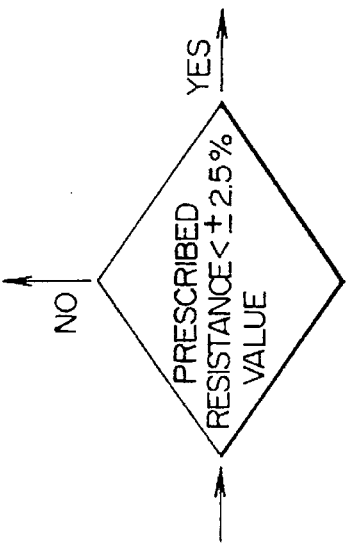
Figure 14A:
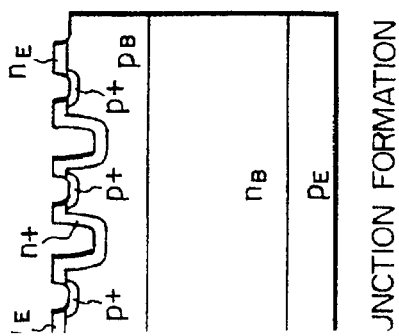

FIG. 11 is a diagram showing an example of a semiconductor circuit configuration with an overvoltage self-protection semiconductor device according to the present invention applied to a static var compensator. In FIG. 11, character XL designates the impedance of the power transmission line, Vt a receiving-point voltage, Ic an output current of the static var compensator, Vref a target control voltage, K the gain of a control system, Cc a capacitor, Xc a reactor, and T a valve configured of a plurality of overvoltage self-protection semiconductor devices 100 in series or parallel connection.

In the case of a power transmission system as shown in FIG. 11, an increased load increases the voltage drop across the impedance XL of the transmission line, thereby reducing the receiving-point voltage Vt. In such a case, the drop of the receiving-point voltage T can be suppressed by reducing the reactor current and hence the compensation of the lagging reactive power by the static var compensator.

In the shown example, the reactor current is controlled by a circuit using an overvoltage self-protection semiconductor device 100 according to the present invention. For this purpose, this circuit includes a pulse phase shifter and a constant-voltage controller using the voltage difference between the receiving-point voltage Vt and the target control voltage Vref.

The semiconductor circuits shown in FIGS. 7 to 11 are configured of an overvoltage self-protection semiconductor device according to the present invention. In view of the fact that a plurality of overvoltage self-protection semiconductor devices according to the present invention capable of achieving the voltage of 6000±100 V with a uniform breakover voltage are used, the number of series connections is reduced by about 10% as compared with the prior art which uses an overvoltage self-protection semiconductor device of 5500±500 V in breakover voltage. In comparison with the conventional thyristor with a breakdown voltage of 4000 V having no overvoltage self-protection function, on the other hand, the number of series connections in the circuit according to the present invention is reduced to two thirds, thereby considerably reducing the size and improving the reliability of the converter.

We claim:

1. An overvoltage self-protection semiconductor device comprising a thyristor portion and an overvoltage protection portion:

said thyristor portion including:

a first semiconductor layer of first conductivity type formed in a semiconductor substrate;

a second semiconductor layer of second conductivity type formed on one of main surfaces of said semiconductor substrate adjacently to one of the surfaces of said first semiconductor layer;

a third semiconductor layer of second conductivity type adjacent to another surface of said first semiconductor layer;

a plurality of fourth semiconductor layers of first conductivity type formed in spaced relationship with each other on said third semiconductor layer;
a first electrode formed on said second semiconductor layer; and
a second electrode formed on said third semiconductor layer and said fourth semiconductor layers;
said overvoltage protection portion including:
said first semiconductor layer;
said second semiconductor layer;
said third semiconductor layer;
a fifth semiconductor layer of first conductivity type having a high impurities concentration formed on said third semiconductor layer; and
a sixth semiconductor layer of second conductivity type having a high impurities concentration formed on said third semiconductor layer adjacent to said fifth semiconductor layer to form a pn junction between said fifth and sixth semiconductor layers, said sixth semiconductor layer bridging said fifth semiconductor layer and one of said fourth semiconductor layers;
wherein the breakover voltage of said overvoltage protection portion is lower than that of the thyristor portion, and
wherein said fifth semiconductor layer of the overvoltage protection portion is spaced apart from a main junction between the first and third semiconductor layers by a predetermined distance so that when a predetermined overvoltage is applied to said first electrode and said second electrode, a depletion layer extending from said main junction due to the overvoltage will punch through the third semiconductor layer to the fifth semiconductor layer to provide overvoltage protection to the main device.

2. An overvoltage self-protection semiconductor device according to claim 1, wherein:
when an overvoltage is applied to said first electrode and said second electrode, the pn junction formed between said fifth semiconductor layer and said sixth semiconductor layer is subjected to a selected one of avalanche breakdown and zener breakdown.

3. An overvoltage self-protection semiconductor device comprising a thyristor portion and an overvoltage protection portion:
said thyristor portion including:
a first semiconductor layer of first conductivity type formed in a semiconductor substrate;
a second semiconductor layer of second conductivity type formed on one of main surfaces of said semiconductor substrate adjacently to one of the surfaces of said first semiconductor layer;
a third semiconductor layer of second conductivity type adjacent to another surface of said first semiconductor layer;
a plurality of fourth semiconductor layers of first conductivity type formed in spaced relationship with each other on said third semiconductor layer;
a first electrode formed on said second semiconductor layer; and
a second electrode formed on said third semiconductor layer and said fourth semiconductor layers;
said overvoltage protection portion including:
said first semiconductor layer;
said second semiconductor layer;
said third semiconductor layer;
a fifth semiconductor layer of first conductivity type having a high impurities concentration formed on said third semiconductor layer; and
a sixth semiconductor layer of second conductivity type having a high impurities concentration formed on said third semiconductor layer adjacent to said fifth semiconductor layer to form a pn junction between said fifth and sixth semiconductor layers, said sixth semiconductor layer bridging said fifth semiconductor layer and one of said fourth semiconductor layers;
wherein a thickness of the third semiconductor layer directly under the fifth semiconductor layer is smaller than that of the third semiconductor layer directly under the fourth semiconductor layer, and
wherein said fifth semiconductor layer of the overvoltage protection portion is spaced apart from a main junction between the first and third semiconductor layers by a predetermined distance so that when a predetermined overvoltage is applied to said first electrode and said second electrode, a depletion layer extending from said main junction due to the overvoltage will punch through the third semiconductor layer to the fifth semiconductor layer to provide overvoltage protection to the device.

4. An overvoltage self-protection semiconductor device according to claim 3,
wherein when an overvoltage is applied to said first electrode and said second electrode, the pn junction formed between said fifth semiconductor layer and said sixth semiconductor layer is subjected to a selected one of avalanche breakdown and zener breakdown.

5. An overvoltage self-protection semiconductor device comprising a thyristor portion and an overvoltage protection portion:
said thyristor portion including:
a first semiconductor layer of first conductivity type formed in a semiconductor substrate;
a second semiconductor layer of second conductivity type formed on one of main surfaces of said semiconductor substrate adjacently to one of the surfaces of said first semiconductor layer;
a third semiconductor layer of second conductivity type adjacent to another surface of said first semiconductor layer;
a plurality of fourth semiconductor layers of first conductivity type formed in spaced relationship with each other on said third semiconductor layer;
a first electrode formed on said second semiconductor layer; and
a second electrode formed on said third semiconductor layer and said fourth semiconductor layers;
said overvoltage protection portion including:
said first semiconductor layer;
said second semiconductor layer;
said third semiconductor layer;
a fifth semiconductor layer of first conductivity type having a high impurities concentration formed on said third semiconductor layer; and
a sixth semiconductor layer of second conductivity type having a high impurities concentration formed on said third semiconductor layer adjacent to said fifth semiconductor layer to form a pn junction between said fifth and sixth semiconductor layers, said sixth semiconductor layer bridging said fifth semiconductor layer and one of said fourth semiconductor layers, wherein said fifth semiconductor layer of the overvoltage protection portion is spaced apart from a main junction between the first and third semiconductor layers by a predetermined distance so that when a predetermined overvoltage is applied to said first electrode and said second electrode, a depletion layer extending from said main junction due to the overvoltage will punch through the third semiconductor layer to the fifth semiconductor layer to provide overvoltage protection to the device.

6. An overvoltage self-protection semiconductor device according to claim 5, wherein when an overvoltage is applied to said first electrode and said second electrode, the pn junction formed between said fifth semiconductor layer and said sixth semiconductor layer is subjected to a selected one of avalanche breakdown and zener breakdown.

7. An overvoltage self-protection semiconductor device comprising a thyristor portion, an auxiliary thyristor portion and an overvoltage protection portion:

said thyristor portion including:
a first semiconductor layer of first conductivity type formed in a semiconductor substrate;
a second semiconductor layer of second conductivity type formed on one of main surfaces of said semiconductor substrate adjacently to one of the surfaces of said first semiconductor layer;
a third semiconductor layer of second conductivity type adjacent to another surface of said first semiconductor layer;
a plurality of fourth semiconductor layers of first conductivity type formed in spaced relationship with each other on said third semiconductor layer;
a first electrode formed on said second semiconductor layer; and
a second electrode formed on said third semiconductor layer and said fourth semiconductor layers;

said auxiliary thyristor portion including:
said first semiconductor layer;
said second semiconductor layer;
said third semiconductor layer;
a fifth semiconductor layer of first conductivity type formed in spaced relationship with said fourth semiconductor layers on said third semiconductor layer; and
a third electrode formed on said third semiconductor layer and said fifth semiconductor layer;

said overvoltage protection portion including:
said first semiconductor layer;
said second semiconductor layer;
said third semiconductor layer;
a sixth semiconductor layer of first conductivity type having a high impurities concentration formed on said third semiconductor layer; and
a seventh semiconductor layer of second conductivity type having a high impurities concentration formed on said third semiconductor layer adjacent to said sixth semiconductor layer to form a pn junction between said sixth and seventh semiconductor layers, said seventh semiconductor layer bridging said sixth semiconductor layer and said fifth semiconductor layer, wherein said sixth semiconductor layer of the overvoltage protection portion is spaced apart from a main junction between the first and third semiconductor layers by a predetermined distance so that when a predetermined overvoltage is applied to said first electrode and said second electrode, a depletion layer extending from said main junction due to the overvoltage will punch through the third semiconductor layer to the sixth semiconductor layer to provide overvoltage protection to the device.

8. An overvoltage self-protection semiconductor device according to claim 7, wherein when an overvoltage is applied to said first electrode and said second electrode, said auxiliary thyristor portion is turned on by a selected one of avalanche breakdown and zener breakdown caused in the pn junction formed between said seventh semiconductor layer and said sixth semiconductor layer.

9. An overvoltage self-protection semiconductor device comprising a thyristor portion and an overvoltage protection portion:

said thyristor portion including:
a first semiconductor layer of first conductivity type formed in a semiconductor substrate;
a second semiconductor layer of second conductivity type formed on one of main surfaces of said semiconductor substrate adjacently to one of the surfaces of said first semiconductor layer;
a third semiconductor layer of second conductivity type adjacent to another surface of said first semiconductor layer;
a plurality of fourth semiconductor layers of first conductivity type formed in spaced relationship with each other on said third semiconductor layer;
a first electrode formed on said second semiconductor layer; and
a second electrode formed on said third semiconductor layer and said fourth semiconductor layers;

said overvoltage protection portion including:
said first semiconductor layer;
said second semiconductor layer;
said third semiconductor layer;
a well region formed in said third semiconductor layer and an island region formed in said well region;
a fifth semiconductor layer of first conductivity type having a high impurities concentration formed in said well region;
a sixth semiconductor layer of second conductivity type having a high impurities concentration formed in a peripheral region of said well region adjacent to said fifth semiconductor layer to form a pn junction between said fifth and sixth semiconductor layers, said sixth semiconductor layer bridging said fifth semiconductor layer and one of said fourth semiconductor layers; and
a seventh semiconductor layer of second conductivity type having a high impurities concentration formed in said island region, wherein said fifth semiconductor layer of the overvoltage protection portion is spaced apart from a main junction between the first and third semiconductor layers by a predetermined distance so that when a predetermined overvoltage is applied to said first electrode and said second electrode, a depletion layer extending from said main junction due to the overvoltage will punch through the third semiconductor layer to the fifth semiconductor layer to provide overvoltage protection to the device.

10. An overvoltage self-protection semiconductor device according to claim 9, wherein when an overvoltage is applied to said first electrode and said second electrode, the pn junction formed between said fifth semiconductor layer and said sixth semiconductor layer is subjected to a selected one of avalanche breakdown and zener breakdown.

11. An overvoltage self-protection semiconductor device comprising:
- a first semiconductor region of first conductivity type formed in a semiconductor substrate;
- a second semiconductor region of second conductivity type formed adjacently to said first semiconductor region;
- a third semiconductor region of second conductivity type formed in a form of a well in said first semiconductor region;
- a fourth semiconductor region of first conductivity type formed in a form of a well in said third semiconductor region;
- a fifth semiconductor region of first conductivity type having a high impurities concentration formed in said third semiconductor region;
- a sixth semiconductor region of second conductivity type having a high impurities concentration formed adjacently to said fifth semiconductor region in said third semiconductor region to form a pn junction with said fifth semiconductor region;
- a first electrode formed on said second semiconductor region; and
- a second electrode formed on said fourth semiconductor region;
- wherein the fifth semiconductor region is spaced apart from a main junction between the first and third semiconductor regions by a predetermined distance so that when a predetermined overvoltage is applied to the first and second electrodes, a depletion layer extending from said main junction will punch through said third semiconductor region to said fifth semiconductor region to provide overvoltage protection for the semiconductor device.

12. An overvoltage self-protection semiconductor device according to claim 11,
wherein when said predetermined overvoltage is applied to said first electrode and said second electrode, the pn junction formed between said fifth semiconductor region and said sixth semiconductor region is subjected to a selected one of avalanche breakdown and zener breakdown.

13. An overvoltage self-protection semiconductor device with a pair of main surfaces, comprising a thyristor portion including at least first, second and third semiconductor layers formed adjacently to each other for supplying a main current between first and second electrodes and a breakover portion;
wherein said breakover portion includes a fourth semiconductor layer of a first conductivity type having a high impurities concentration formed in one of the main surfaces and a plurality of fifth semiconductor layers having a high impurities concentration of a second conductivity type formed to be isolated by said first semiconductor layer, wherein said plurality of fifth semiconductor layers form pn junctions with said fourth semiconductor layer,
wherein said second electrode is coupled to said first and second semiconductor layers, and wherein a main junction between said second and third semiconductor layers of said thyristor portion and said fourth semiconductor layer of said breakdown portion are spaced apart from one another by a predetermined distance so that when a predetermined overvoltage is applied between said first and second electrodes to said thyristor portion, a depletion layer extending from said main junction will punch through to said fourth semiconductor layer to provide overvoltage protection for said semiconductor device.

14. An overvoltage self-protection semiconductor device according to claim 13, further comprising an auxiliary thyristor portion and a pilot thyristor portion,
wherein a depletion layer extending to a semiconductor layer formed in a lower portion of said fourth semiconductor layer having a high impurities concentration is brought into contact with another depletion layer in thermal equilibrium on a pilot thyristor side of a junction of semiconductor layers having a high impurities concentration of opposite conductivity types to one another after contacting a lower surface of said fourth semiconductor layer having a high impurities concentration, whereby said breakover portion is subjected to selected one of avalanche and zener breakdown.

15. A semiconductor circuit comprising a plurality of overvoltage self-protection semiconductor devices according to claim 13 for converting AC power into DC power.

16. A semiconductor circuit comprising a plurality of overvoltage self-protection semiconductor devices according to claim 13 for converting DC power into AC power.

17. A semiconductor circuit comprising a plurality of overvoltage self-protection semiconductor devices according to claim 13 for converting AC power of first frequency into AC power of second frequency.

18. A semiconductor circuit comprising a plurality of overvoltage self-protection semiconductor devices according to claim 13 for compensating reactive power.

19. A semiconductor circuit system comprising a plurality of semiconductor circuits according to claim 15 for effecting high-voltage DC transmission.

20. An overvoltage self-protection semiconductor device with a pair of main surfaces, comprising at least three adjacent semiconductor layers including a plurality of first semiconductor layers having a high impurities concentration of first conductivity type formed in spaced relationship with each other on a surface of a second semiconductor layer adjacent to a lower portion of the first semiconductor layers at one of the main surfaces, a third semiconductor layer of a first conductivity type adjacent to a lower surface of said second semiconductor layer, and a fourth semiconductor layer of second conductivity type, said first, second, third and fourth semiconductor layers being formed sequentially, a first electrode being formed on at least one of said first semiconductor layers, and a second electrode being formed on said fourth semiconductor layer,
wherein said overvoltage self-protection semiconductor device includes an overvoltage protection portion including at least one of said first semiconductor layers which does not have said first electrode formed thereon, said at least one of said first semiconductor layers and said second semiconductor layer making up a pn junction portion having a potential barrier, and wherein a plurality of portions are provided adjacent to said pn junction portion, wherein said plurality of portions do not have said first electrode formed thereon, and wherein said plurality of portions provide regions having a high impurities concentration in the surface of the second semiconductor layer at said one of said main surfaces.

21. An overvoltage self-protection semiconductor device according to claim 20, wherein a first structure comprised the portion of the first semiconductor layers, which portion does not have the first electrode formed thereon, the second, third and fourth semiconductor layers have a lower breakdown voltage than a breakdown voltage of a second structure comprised of the rest of the first semiconductor layers which have the first electrode formed thereon, and the second, third and fourth semiconductor layers, wherein a depletion layer extending into the second semiconductor layer reaches the portion of said first semiconductor layers at said lower breakdown voltage, and wherein an electric field intensity is higher in the pn junction portion having a potential barrier including said portion of said first semiconductor layers on which the first electrode is not formed and a selected one of a fifth semiconductor layer having a high impurity concentration and said region of the second semiconductor layer having the high impurities concentration formed in the one of the main surfaces than that of the rest of the first semiconductor layers, thereby causing a breakdown.

22. An overvoltage self-protection semiconductor device according to claim 20, wherein at least one of said first semiconductor layers and said second semiconductor layer have a portion electrically connected at the first electrode.

23. An overvoltage self-protection semiconductor device with a pair of main surfaces, comprising at least three adjacent semiconductor layers including a plurality of first semiconductor layers having a high impurities concentration of first conductivity type isolated from each other on one surface of a second semiconductor layer adjacent to a lower portion of the plurality of first semiconductor layers, a third semiconductor layer of first conductivity type adjacent to a lower surface of the second semiconductor layer and a fourth semiconductor layer of second conductivity type, said semiconductor layers being formed sequentially, said device further comprising a first electrode formed on at least one of said first semiconductor layers and a second electrode formed on said fourth semiconductor layer, wherein at least another one of said first semiconductor layers includes a portion not having the first electrode formed thereon, and wherein a pn junction having a potential barrier including at least the another one of the first semiconductor layers and the second semiconductor layer has a plurality of fifth semiconductor layers having a high impurities concentration of second conductivity type formed in isolation from each other adjacently to said portion of said at least the another one of the first semiconductor layers not having the first electrode formed thereon.

24. An overvoltage self-protection semiconductor device according to claim 23, wherein a first structure comprises the portion of the first semiconductor layers, which portion does not have the first electrode formed thereon, the second, third and fourth semiconductor layers have a lower breakdown voltage than a breakdown voltage of a second structure comprised of the rest of the first semiconductor layers which have the first electrode formed thereon, and the second, third and fourth semiconductor layers, wherein a depletion layer extending into the second semiconductor layer reaches the portion of said first semiconductor layers at said lower breakdown voltage, and wherein an electric field intensity is higher in the pn junction portion having a potential barrier including said portion of said first semiconductor layers on which the first electrode is not formed and a selected one of a fifth semiconductor layer having a higher impurity concentration than that of the rest of the first semiconductor layers, thereby causing a breakdown.

25. An overvoltage self-protection semiconductor device according to claim 23, wherein at least one of said first semiconductor layers and said second semiconductor layer have a portion electrically connected to the first electrode.

* * * * *